United States Patent
Oh

(10) Patent No.: US 8,598,905 B2
(45) Date of Patent: Dec. 3, 2013

(54) SYSTEM AND PACKAGE INCLUDING PLURAL CHIPS AND CONTROLLER

(75) Inventor: Seung-Min Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/334,038

(22) Filed: Dec. 21, 2011

(65) Prior Publication Data

US 2012/0169370 A1 Jul. 5, 2012

(30) Foreign Application Priority Data

Dec. 30, 2010 (KR) .......................... 10-2010-0138870

(51) Int. Cl.
*H03K 17/16* (2006.01)
(52) U.S. Cl.
USPC ............................................................ 326/30
(58) Field of Classification Search
USPC ............................................................ 326/30
See application file for complete search history.

(56) References Cited

U.S. PATENT DOCUMENTS

| | | | | |
|---|---|---|---|---|
| 4,831,358 A * | 5/1989 | Ferrio et al. | .................. | 370/439 |
| 6,496,889 B1 * | 12/2002 | Perino et al. | .................. | 710/110 |
| 6,687,780 B1 * | 2/2004 | Garlepp et al. | ............... | 710/305 |
| 6,983,023 B2 * | 1/2006 | Osaka et al. | .................. | 375/257 |
| 7,346,051 B2 * | 3/2008 | Nakayama et al. | ........... | 370/386 |
| 2004/0095952 A1 * | 5/2004 | Zhang et al. | ................... | 370/438 |
| 2004/0196064 A1 * | 10/2004 | Garlepp et al. | ................. | 326/30 |
| 2005/0135182 A1 * | 6/2005 | Perino et al. | ............. | 365/230.06 |
| 2005/0205983 A1 * | 9/2005 | Origasa et al. | ................ | 257/686 |
| 2005/0258860 A1 * | 11/2005 | Satou et al. | ..................... | 326/30 |
| 2011/0307671 A1 * | 12/2011 | Fox et al. | ...................... | 711/154 |
| 2011/0316580 A1 * | 12/2011 | McCall et al. | .................. | 326/30 |
| 2012/0182044 A1 * | 7/2012 | Oh | ................................. | 326/30 |

FOREIGN PATENT DOCUMENTS

KR 1020090089174 8/2009
KR 1020100102924 9/2010

OTHER PUBLICATIONS

Office Action issued by the Korean Intellectual Property Office on Aug. 29, 2012.
Notice of Allowance issued by the Korean Intellectual Property Office on Jan. 25, 2013.

* cited by examiner

*Primary Examiner* — Thienvu Tran
(74) *Attorney, Agent, or Firm* — IP & T Group LLP

(57) ABSTRACT

A system includes an input/output channel and a plurality of chips coupled to the input/output channel, wherein only one chip of the plurality of chips performs a termination operation for impedance matching of the input/output channel.

10 Claims, 5 Drawing Sheets

SYSTEM AND PACKAGE INCLUDING PLURAL CHIPS AND CONTROLLER

CROSS-REFERENCE TO RELATED APPLICATIONS

The present application claims priority of Korean Patent Application No. 10-2010-0138870, filed on Dec. 30, 2010, which is incorporated herein by reference in its entirety.

BACKGROUND

1. Field

Exemplary embodiments of the present invention relate to impedance matching in a system and package including a plurality of chips.

2. Description of the Related Art

A variety of semiconductor chips implemented as integrated chips, such as a CPU, a memory, and a gate array, are assembled into various electronic products such as a personal computer, a server, and a workstation. In most cases, a semiconductor chip includes a receiver circuit configured to receive various signals through an input pad and an output circuit configured to provide an internal signal through an output pad.

As the operation speed of electronic products increases, the swing width of signals interfaced between semiconductor chips has been gradually reduced. The swing width is reduced to minimize a delay time required for signal transmission. However, as the swing width is reduced, the influence of external noise increases, and signal reflection caused by impedance mismatching becomes severe at the interface terminal. The impedance mismatching occurs due to variations in external noise, power supply voltage, operation temperature, or fabrication process. When the impedance mismatching occurs, transmitting data at high speed may be difficult, and data outputted from a data output terminal of a semiconductor device may be distorted. Therefore, when a semiconductor chip receives the distorted output signal through an input terminal, a setup/hold fail or determination mistake for input level may frequently occur.

A memory chip implementing high operation speed employs an impedance matching circuit within the integrated circuit chip. The impedance matching circuit is called an on-die termination circuit. When data is inputted to the integrated circuit chip through an I/O channel, the impedance matching circuit performs a termination operation of the I/O channel to match impedance.

FIG. 1 illustrates a termination circuit provided for impedance matching of a semiconductor chip.

The termination circuit 110 includes a plurality of pull-up resistors 111 to 114, a plurality of pull-down resistors 115 to 118, and a plurality of switches SW1 to SW8 configured to turn on/off the resistors. When data (or a signal) is inputted through an I/O pad 101, some or all of the pull-up resistors 111 to 114 and some or all of the pull-down resistors 115 to 118 are turned on. As a result, the impedance of an I/O channel coupled to the I/O pad 101 is matched. As a result of the impedance matching, an input buffer 102 may recognize the data correctly.

During the termination operation, the number of resistors to be turned on among the plurality of pull-up resistors 111 to 114 and the plurality of pull-down resistors 115 to 118 changes depending on a termination resistance value. The termination resistance value is decided by the initial setting of the semiconductor chip or by an operation of a calibration circuit inside the semiconductor chip.

Additionally, a plurality of memory chips may be stacked within one package and share an I/O channel.

SUMMARY

An embodiment of the present invention is directed to a method for effectively performing a termination operation for impedance matching of an I/O channel, when data is inputted through the I/O channel, where a plurality of memory chips or a plurality of chips share the I/O channel.

In accordance with an embodiment of the present invention, a system includes an input/output channel and a plurality of chips coupled to the input/output channel. Only one chip of the plurality of chips performs a termination operation for impedance matching of the input/output channel.

In accordance with another embodiment of the present invention, a package includes: at least one package input/output pins; and a plurality of chips coupled to the one or more package input/output pins. When a termination command is applied to the package, only one chip of the plurality of chips performs a termination operation for impedance matching of the one or more input/output pins.

The package may further include a package termination pin configured to receive the termination command. The termination pin may be coupled to the only one chip of the plurality of chips.

In accordance with yet another embodiment of the present invention, a system includes an input/output channel, a master chip coupled to the input/output channel, and a plurality of slave chips coupled to the input/output channel. Only one slave chip of the plurality of slave chips performs a termination operation for impedance matching of the input/output channel.

In accordance with still another embodiment of the present invention, there is provided a controller for controlling a plurality of memory chips sharing an input/output channel. The controller controls the plurality of memory chips such that only one of the memory chips performs a termination operation for impedance matching of the input/output channel.

DETAILED DESCRIPTION

Figure 1:
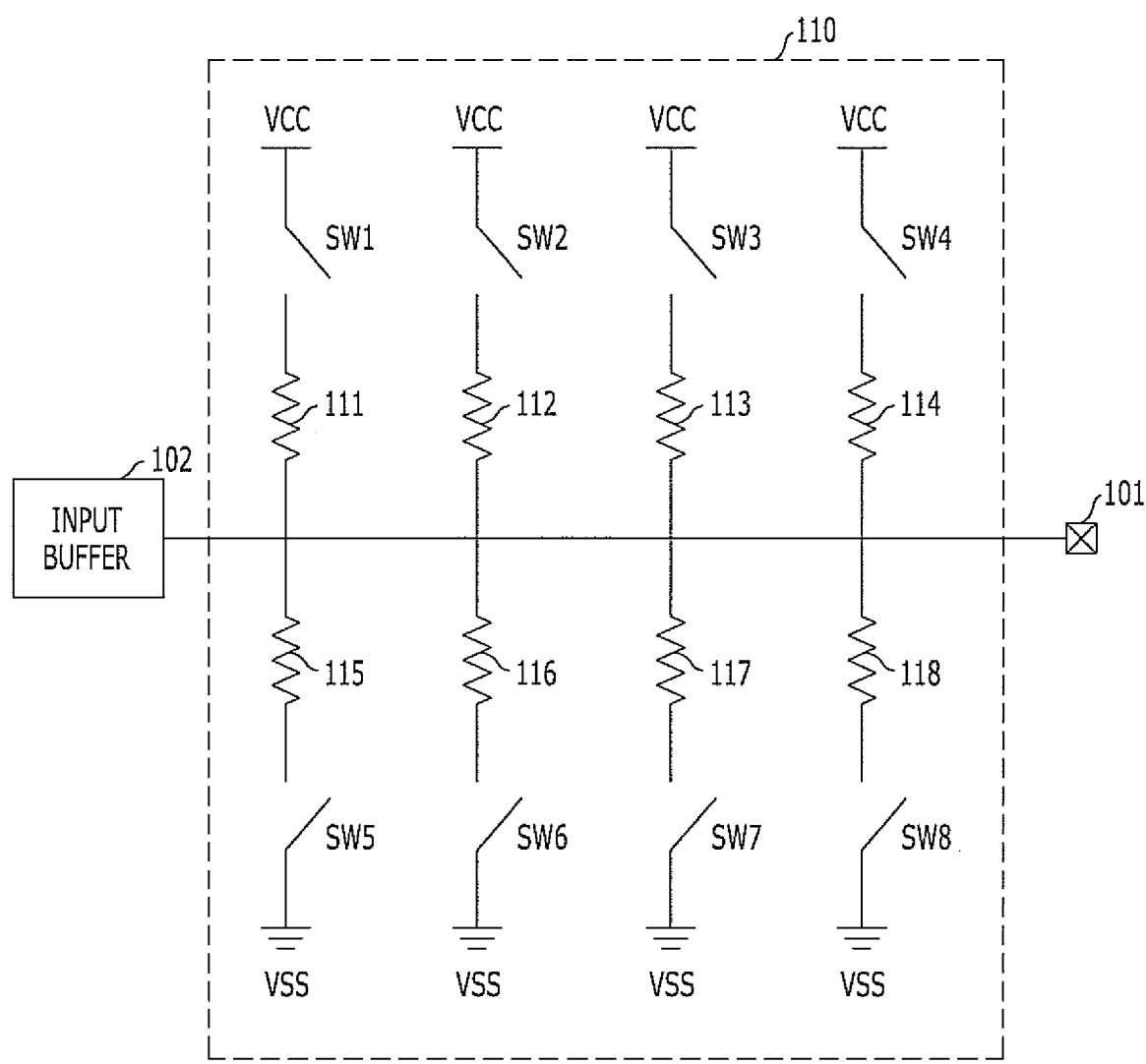
FIG. 1 illustrates a termination circuit provided for impedance matching of a semiconductor chip.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
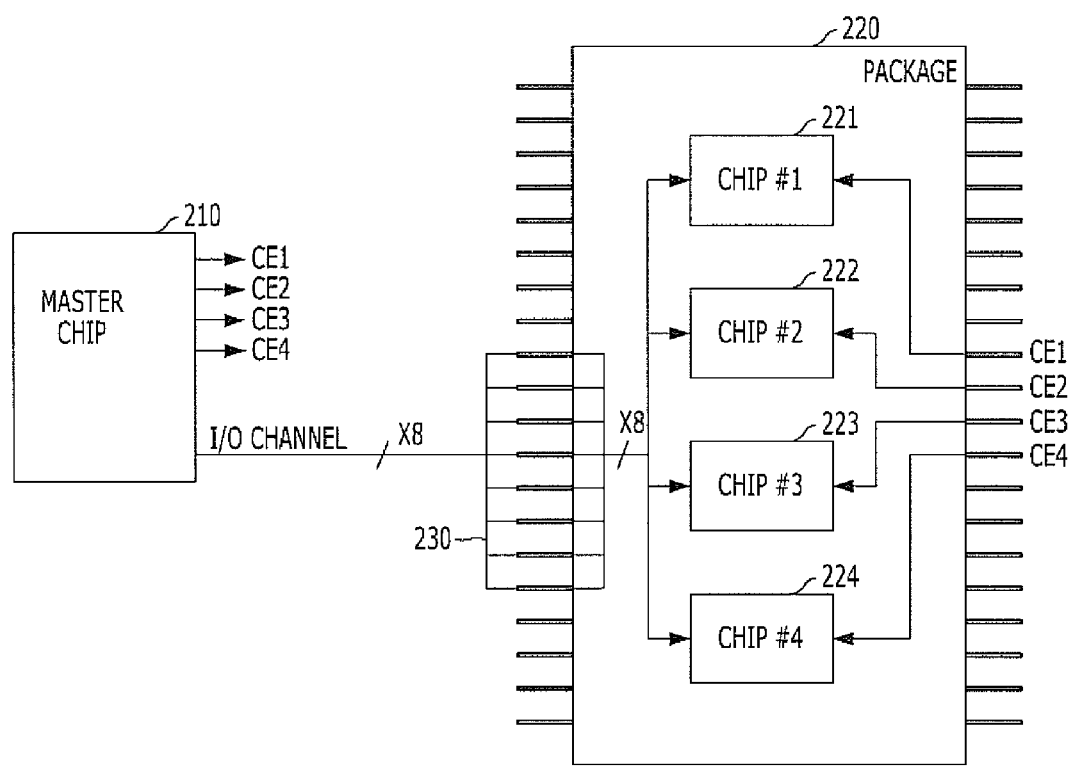
FIG. 2 illustrates a system including a master chip and a package in accordance with an embodiment of the present invention.

FIG. 2 illustrates a system including a master chip and a package in accordance with an embodiment of the present invention.

Referring to FIG. 2, the system in accordance with the embodiment of the present invention includes a master chip 210 and a package 220 having a plurality of slave chips 221 to 224.

The master chip 210 is a controller to control the plurality of slave chips 221 to 224 inside the package, and the plurality of slave chips 221 to 224 refer to chips which perform specific operations according to the control of the master chip 210. For example, the master chip 210 may serve as a memory controller, and each of the slave chips 221 to 224 may serve as a memory.

An I/O channel I/O CHANNEL is provided to transmit and receive data (or signals) between the master chip 210 and the slave chips 221 to 224. Since the plurality of slave chips 221 to 224 is provided within one package 220, the I/O channel I/O CHANNEL is coupled to an internal channel through I/O pins 230 formed on the package 220. FIG. 2 illustrates that the I/O channel includes eight lines (that is, ×8). The plurality of slave chips 221 to 224 may be stacked inside the package 220.

Chip enable signals CE1 to CE4 are allocated to the respective slave chips 221 to 224. The chip enable signals CE1 to CE4 decide which chip among the slave chips 221 to 224 transmits data and which chip receives data to and from the master chip 210. For example, while the chip enable signal CE2 is activated, the slave chip 222 transmits and receives data through the I/O channel I/O CHANNEL according to the control of the master chip 222.

A termination operation refers to an operation of terminating the I/O channel I/O CHANNEL to a constant resistance value (for example, 120 or 240Ω) when data is transmitted to the package 220 from the master chip 210 through the I/O channel I/O CHANNEL. The I/O channel I/O CHANNEL is terminated for impedance matching of the I/O channel I/O CHANNEL. For example, only one chip of the slave chips 221 to 224 sharing the I/O channel I/O CHANNEL performs a termination operation when data is transmitted from the master chip 210 to the package 220 through the I/O channel I/O CHANNEL.

Although, for example, only one chip of the slave chips 221 to 224 sharing the I/O channel I/O CHANNEL terminates the I/O channel I/O CHANNEL, the impedance matching of the I/O channel I/O CHANNEL may be achieved. When several chips (for example, the slave chips 221 to 224) simultaneously terminate the I/O channel I/O CHANNEL, termination resistors of the respective chips 221 to 224 may be coupled in parallel, thereby changing the termination resistance value. Furthermore, when the I/O channel I/O CHANNEL is controlled to have a correct resistance value for impedance matching while the plurality of slave chips 221 to 224 simultaneously terminate the I/O channel I/O CHANNEL, a large burden may be laid upon the master chip 210. In this embodiment of the present invention, a chip among the slave chips 221 to 224 sharing the I/O channel I/O CHANNEL is selected to perform a termination operation on the I/O channel selected. The selected chip performs a termination operation whenever data is transmitted to one of the slave chips 221 to 224 through the I/O channel I/O CHANNEL from the master chip 210.

FIG. 2 illustrates that the plurality of slave chips 221 to 224 sharing the I/O channel I/O CHANNEL are provided in one package 220. As described above, however, a chip among the plurality of chips 221 to 224 sharing the I/O channel I/O CHANNEL is selected to perform a termination operation and performs a termination operation on the I/O channel I/O CHANNEL. Therefore, the slave chips 221 to 224 sharing the I/O channel I/O CHANNEL are not necessarily provided inside one package 200.

Figure 3:
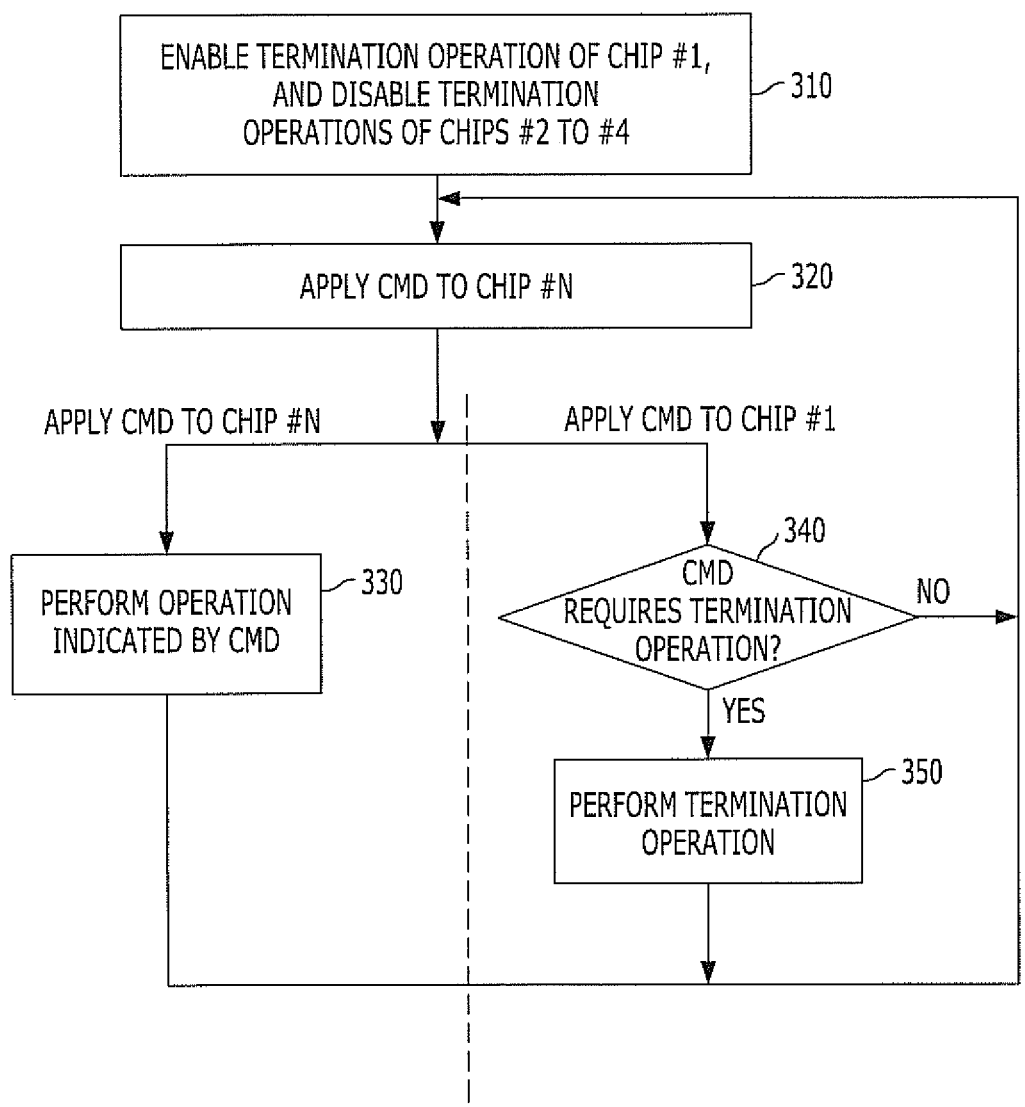
FIG. 3 illustrates a method where one chip of slave chips in the system of FIG. 2 performs a termination operation on an I/O channel.

FIG. 3 illustrates a method where one chip of the slave chips 221 to 224 in the system of FIG. 2 performs a termination operation on the I/O channel I/O CHANNEL.

Referring to FIG. 3, at step S310, the master chip 210 sets one chip of the slave chips 221 to 224 to perform a termination operation. The setting operation is performed during the initial setting for the slave chips 221 to 224. Examples of the initial setting operation may include a mode register setting (MRS) of DRAM and a set feature of a flash memory. Various chips other than memories also include a unique mode for setting a chip when power is first applied to the chip, and the setting for the termination operation may be performed during this mode. When the setting for the termination operation (S310) is completed, one chip of the slave chips 221 to 224 is set to perform a termination operation according to a command signal, which is subsequently applied, and the chips not selected to perform the termination operation ignore the command to perform a termination operation. Here, it is assumed that the first slave chip 221 is set to perform the termination operation.

After the initial setting operation (S310) is completed, a command CMD is applied to an N-th slave chip from the master chip 210 at step S320. The command CMD may be applied to the slave chips 221 to 224 through the I/O channel I/O CHANNEL or may be applied to the slave chips 221 to 224 through a separately-provided command channel (not illustrated). The command CMD may be applied to all the slave chips 221 to 224. However, since the chip enable signals CE1 to CE4 are separately provided to the respective slave chips 221 to 224, which chip among the slave chips 221 to 224 that received the command CMD may be determined. For example, when the command CMD is applied through the I/O channel I/O CHANNEL in a state where the chip enable signal CE3 is activated, the system may determine that the corresponding command CMD instructs the slave chip 223 to perform a specific operation.

After the application of the command CMD to the N-th slave chip (S320), the N-th slave chip performs an operation indicated by the command CMD at step S330. For example, when the command CMD is a write command, the N-th slave chip performs an operation of writing data, more specifically, receiving and storing data, and when the command CMD is a read command, the N-th slave chip performs an operation of reading data, more specifically, outputting stored data.

At step S340, the first slave chip 221, which was set to perform a termination operation during the initial setting (S310), determines whether the command applied to the N-th slave chip is a command to perform a termination operation. The termination operation is implemented when high-speed data is inputted through the I/O channel I/O CHANNEL. Whether an operation based on the command CMD applied to the N-th slave chip is accompanied by a high-speed data input may also be determined. For example, when the command applied to the N-th slave chip is a write command, high-speed data will be inputted through the I/O channel I/O CHANNEL. Therefore, the first slave chip 221 performs a termination operation. Furthermore, when the command applied to the N-th slave chip is a read command, a high-speed data input is not accompanied. Therefore, the termination operation of the first slave chip 221 is not performed.

When the termination operation is required, the first slave chip 221 performs an operation of terminating the I/O channel I/O CHANNEL at step S350. Otherwise, the first slave chip 221 does not perform any operation.

When the command applied at the step S320 is a command for the first slave chip 221, which was set to perform a termination operation (more specifically, N=1), the first slave chip 221 may perform all the operations of the steps S330, S340, and S350. For example, when a write command for the first slave chip 221 is applied at the step S320, the first slave chip 221 receives high-speed data through the I/O channel I/O CHANNEL and simultaneously performs the termination operation on the I/O channel I/O CHANNEL.

Figure 4:
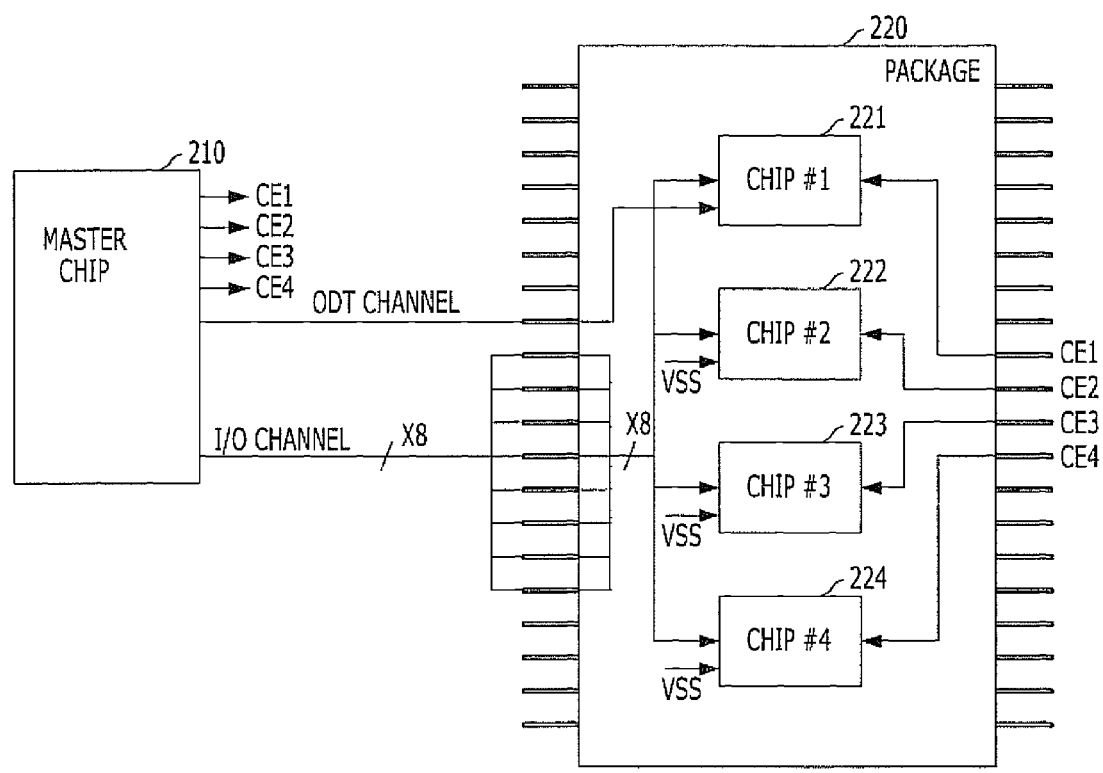
FIG. 4 illustrates a system including a master chip and a package in accordance with another embodiment of the present invention.

FIG. 4 illustrates a system including a master chip 210 and a package 220 in accordance with another embodiment of the present invention. FIG. 4 illustrates an embodiment where a termination operation is controlled through a termination channel ODT CHANNEL that is provided between the master chip 210 and the package 220 for termination.

Referring to FIG. 4, the termination channel ODT CHANNEL is provided between the master chip 210 and the package 220. The termination channel ODT CHANNEL is a channel that the master chip 210 implements to control termination of the package 220. When a signal on the termination channel ODT CHANNEL is activated, the package 220 terminates the I/O channel I/O CHANNEL. More specifically, the master chip 210 commands the package 220 to terminate the I/O channel I/O CHANNEL through the termination channel ODT CHANNEL.

As described above, one of the plurality of slave chips 221 to 224 sharing the I/O channel I/O CHANNEL is in charge of the termination operation for the I/O channel I/O CHANNEL. The termination channel ODT CHANNEL formed between the master chip 210 and the package 220 is coupled to, for example, only one slave chip 221. Referring to FIG. 4, the termination channel ODT CHANNEL is coupled to a termination pin of the package 200. The termination pin is couple to one slave chip 221 of the slave chips 221 to 224 inside the package 200. Termination pads of the other slave chips 222 to 224 are coupled to ground voltages VSS. As a result, all of the termination pads of the slave chips 222 to 224 are disabled. More specifically, the termination operations of the slave chips 222 to 224 are deactivated.

FIG. 4 illustrates that the slave chips 221 to 224 sharing the I/O channel I/O CHANNEL are provided in one package 220. As described above, however, the slave chips 221 to 224 sharing the I/O channel I/O CHANNEL do not need to be provided in one package 220, but the termination channel ODT CHANNEL may be coupled to one chip 221 of the slave chips 221 to 224 sharing the I/O channel I/O CHANNEL.

Figure 5:
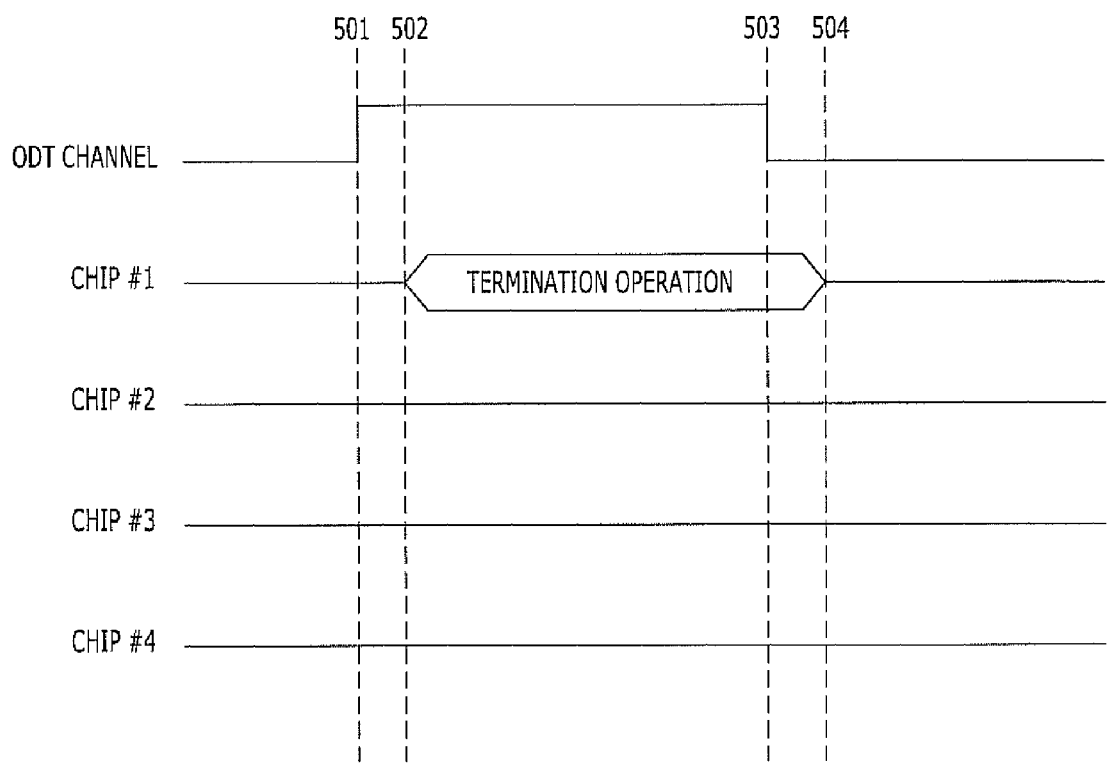
FIG. 5 illustrates the termination operation of the system of FIG. 4.

FIG. 5 illustrates the termination operation of the system of FIG. 4.

Referring to FIG. 5, a signal of the termination channel ODT CHANNEL is activated to 'high' at a time point 501. Subsequently, at a time point 502, the slave chip #1 starts the termination operation for the I/O channel. The time point 502 is a designated time after the time point 501 that is required for starting a termination operation in response to a termination channel. The termination channel ODT CHANNEL is not coupled to the termination pads of the chips CHIP #2 to CHIP #4, but the termination pads are coupled to the ground voltages VSS. Therefore, although the signal of the termination channel ODT CHANNEL is activated, the slave chips CHIP #2 to CHIP #4 do not perform a termination operation.

At a time point 503, the signal of the termination channel ODT CHANNEL is deactivated to 'low'. Subsequently, at a time point 504 after a designated time for stopping the termination operation in response to the termination channel, the slave chip #1 stops the termination operation for the I/O channel.

In accordance with the embodiment of the present invention, one of the plurality of chips sharing the I/O channel performs the termination operation for the shared I/O channel. Therefore, the control of the termination operation is simplified, and correct impedance matching may be performed regardless of how many chips share the I/O channels.

While the present invention has been described with respect to the specific embodiments, it will be apparent to those skilled in the art that various changes and modifications may be made without departing from the spirit and scope of the invention as defined in the following claims.

What is claimed is:

1. A system comprising:
an input/output channel; and
a plurality of chips coupled to the input/output channel, each including an termination circuit,
wherein only one chip of the plurality of chips is set to performs a termination operation for impedance matching of the input/output channel during an initial setting,
wherein when a command requiring the termination operation is applied to anyone of the plurality of chips. the only one chip performs the termination operation.

2. The system of claim 1, wherein the respective chips comprise pads configured to control the termination operation, and
the pads of the chips excluding the only one chip performing the termination operation are disabled.

3. The system of claim 1, wherein the plurality of chips are memory chips.

4. A package comprising:
one or more package input/output pins;
a plurality of chips coupled to the one or more package input/output pins, each including an termination circuit: and
a package termination pin configured to receive the termination command and coupled to only one chip of the plurality of chips,
wherein the only one chip performs a termination operation for impedance matching of the one or more package input/output pins when a signal on the package termination pin is activated.

5. The package of claim 4, wherein the plurality of chips are stacked in the package.

6. The package of claim 4, wherein the plurality of chips are memory chips.

7. A system comprising:
an input/output channel;
a master chip coupled to the input/output channel; and
a plurality of slave chips coupled to the input/output channel, each including an termination circuit,
wherein only one slave chip of the plurality of slave chips is set to performs a termination operation for impedance matching of the input/output channel during an initial setting,
wherein when a command requiring the termination operation is applied to anyone of the plurality slave chips from the master chip, the only one slave chip performs the termination operation.

8. The system of claim 7, wherein the plurality of slave chips are formed in one package.

9. The system of claim 7, wherein the master chip is a memory controller, and
the plurality of slave chips are memory chips.

10. A system comprising:
an input/output channel:
a master chip coupled to the input/output channel;
a plurality of slave chips coupled to the input/output channel, each including an termination circuit: and
a termination channel formed between the master chip and only one slave chip of the plurality of slave chips,
wherein the only one slave chip performs a termination operation for impedance matching of the input/output channel during an initial setting when a signal on the termination channel is activated.

* * * * *